US006884722B2

(12) United States Patent
Grant et al.

(10) Patent No.: US 6,884,722 B2
(45) Date of Patent: Apr. 26, 2005

(54) METHOD OF FABRICATING A NARROW POLYSILICON LINE

(75) Inventors: Casey J. Grant, Hinesburg, VT (US); Robert K. Leidy, Burlington, VT (US); Joel M. Sharrow, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 477 days.

(21) Appl. No.: 09/964,918

(22) Filed: Sep. 27, 2001

(65) Prior Publication Data

US 2004/0077169 A1 Apr. 22, 2004

(51) Int. Cl.[7] .............................................. H01L 21/302
(52) U.S. Cl. ....................... 438/690; 438/704; 438/719; 438/723; 438/753
(58) Field of Search ................................. 438/690, 704, 438/719, 723, 753

(56) References Cited

U.S. PATENT DOCUMENTS

| 5,139,904 | A |   | 8/1992  | Auda et al. |
| 5,431,770 | A |   | 7/1995  | Lee et al. |
| 5,942,449 | A | * | 8/1999  | Meikle ........................ 438/747 |
| 5,965,461 | A |   | 10/1999 | Yang et al. |
| 6,013,570 | A | * | 1/2000  | Yu et al. ...................... 438/595 |
| 6,107,172 | A |   | 8/2000  | Yang et al. |
| 6,316,169 | B1 | * | 11/2001 | Vahedi et al. ............... 430/329 |
| 6,352,867 | B1 | * | 3/2002  | Couteau et al. ................ 438/8 |
| 6,446,641 | B1 | * | 9/2002  | Nakatani ..................... 134/1.3 |

* cited by examiner

Primary Examiner—Nadine G. Norton
Assistant Examiner—Binh X. Tran
(74) Attorney, Agent, or Firm—Schmeiser, Olsen & Watts; William D. Sabo

(57) ABSTRACT

Disclosed is a method of fabricating a polysilicon line, comprising: forming a patterned hard mask layer over a polysilicon layer; patterning the polysilicon layer to provide a hard mask-capped polysilicon line having a first width; and isotropically removing portions of the polysilicon line to a second width.

19 Claims, 4 Drawing Sheets

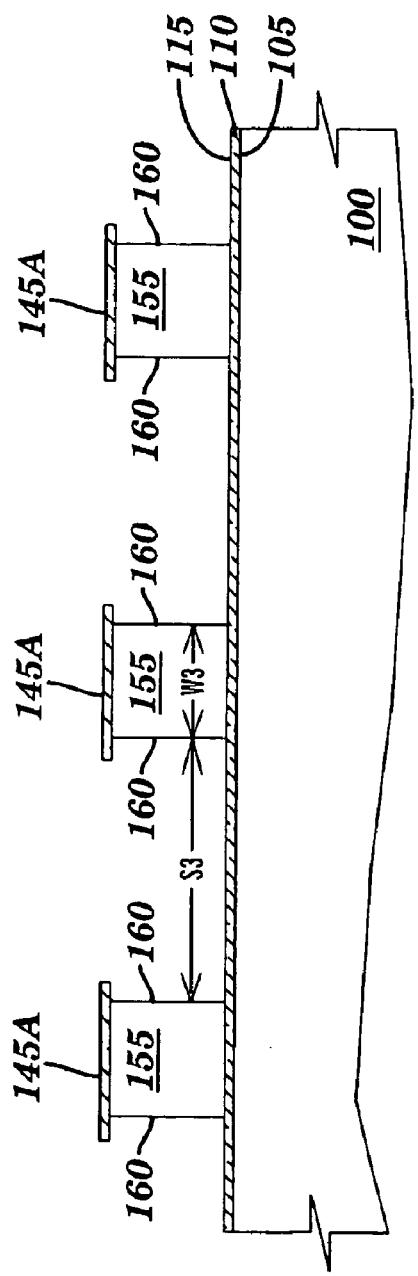
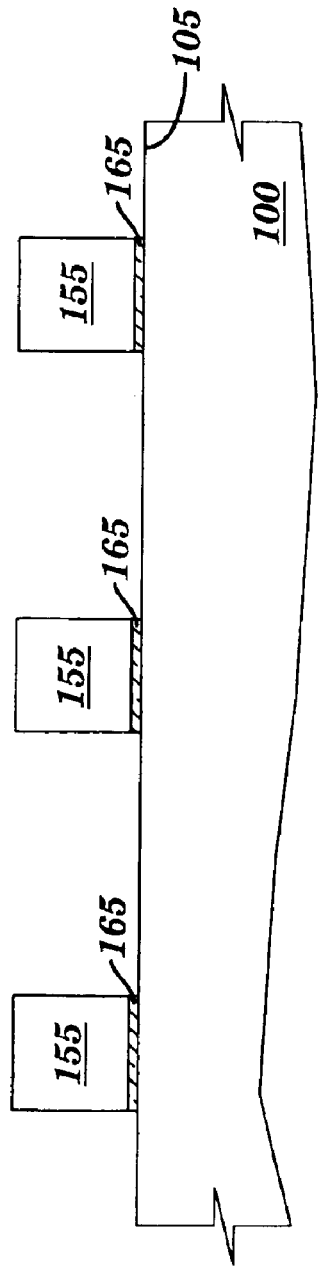

METHOD OF FABRICATING A NARROW POLYSILICON LINE

FIELD OF THE INVENTION

The present invention relates to the field of semiconductor manufacture; more specifically, it relates to a method for forming narrow polysilicon lines and reduced dimension transistor gates.

BACKGROUND OF THE INVENTION

A continuing trend in semiconductor technology is to fabricate integrated circuits with more devices per unit area of die to increased performance, and lower operating voltages. This trend has resulted in shrinking of specific device features and minimum groundrule dimensions in general.

In integrated circuits having field-effect transistors (FETs), one very important feature is the gate conductor width and the attendant device channel width. In many applications the performance characteristics (e.g., switching speed) and density achievable (e.g., overall size of the FETs) are functions of the gate conductor width. Thus, for example, a narrower gate tends to produce a higher performance transistor (e.g., faster) and a smaller device. In the case of dynamic random access memories (DRAMs), in addition to the effects of gate width just noted, there is an effect of polysilicon wordlines and passing wordlines on memory cell density. Narrower polysilicon wordlines and passing wordlines allow denser cell design. In DRAMs, gate conductors and wordlines and passing wordlines are often simultaneously and integrally formed.

Limitations to existing fabrication techniques, notably lithographic tools and process, is limiting the minimum polysilicon line and polysilicon gate width. Lithography is not scaling with the decrease in device channel width, gate width and polysilicon line width. Often polysilicon line and polysilicon gate widths need to be smaller than the minimum feature size producible by the lithographic process. Accordingly, there is a need for efficient and effective fabrication methods for forming polysilicon lines and polysilicon gates that are smaller (even sub-minimum groundrule) and/or result in higher performance devices.

SUMMARY OF THE INVENTION

A first aspect of the present invention is a method of fabricating a polysilicon line, comprising: forming a patterned hard mask layer over a polysilicon layer; patterning the polysilicon layer to provide a hard mask-capped polysilicon line having a first width; and isotropically removing portions of the polysilicon line to a second width.

A second aspect of the present invention is a method of reducing transistor gate dimensions, comprising: forming a patterned hard mask layer over a polysilicon layer, the polysilicon layer formed over a gate dielectric layer; patterning the polysilicon to provide a hard mask-capped polysilicon electrode having a first width; and isotropically removing portions of the polysilicon electrode to a second width.

A third aspect of the present invention is a method of forming a transistor gate, comprising: forming a dielectric layer on a top surface of a substrate; forming a polysilicon layer on a top surface of the dielectric layer; forming a patterned hard mask layer on a top surface of the polysilicon layer; patterning the polysilicon to provide a hard mask-capped polysilicon electrode having a first width; and isotropically removing portions of the polysilicon electrode to a second width.

A fourth aspect of the present invention is a method of forming a transistor gate, comprising: forming a dielectric layer on a top surface of a substrate; forming a polysilicon layer on a top surface of the dielectric layer; forming a patterned hard mask layer on a top surface of the polysilicon layer; patterning the polysilicon to provide a hard mask-capped polysilicon electrode having a first width; measuring the first width; comparing the first width to a target width and determining a delta; calculating an etch time or a number of polysilicon oxidation/isotropic polysilicon etch cycles based on the delta; and performing an isotropic polysilicon etch for the calculated time or performing the calculated number of polysilicon oxidation/isotropic polysilicon etch cycles.

A fifth aspect of the present invention is a polysilicon line fabricated by the process comprising: forming a patterned hard mask layer over a polysilicon layer; patterning the polysilicon to provide a hard mask-capped polysilicon line having a first width; and isotropically removing portions of the polysilicon line to a second width.

A sixth aspect of the present invention is a polysilicon transistor gate fabricated by the process comprising: forming a patterned hard mask layer over a polysilicon layer, the polysilicon layer formed over a gate dielectric layer; patterning the polysilicon to provide a hard mask-capped polysilicon electrode having a first width; isotropically removing portions of the polysilicon electrode to a second width; and removing the patterned hard mask layer.

A seventh aspect of the present invention is a polysilicon transistor gate fabricated by the process comprising: forming a dielectric layer on a top surface of a substrate; forming a polysilicon layer on a top surface of the dielectric layer; forming a patterned hard mask layer on a top surface of the polysilicon layer; patterning the polysilicon to provide a hard mask-capped polysilicon electrode having a first width; isotropically removing portions of the polysilicon electrode to a second width; and removing the patterned hard mask layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 1 through 5 are cross-sectional views illustrating fabrication of a polysilicon line according to the present invention;

DETAILED DESCRIPTION OF THE INVENTION

Figure 1:
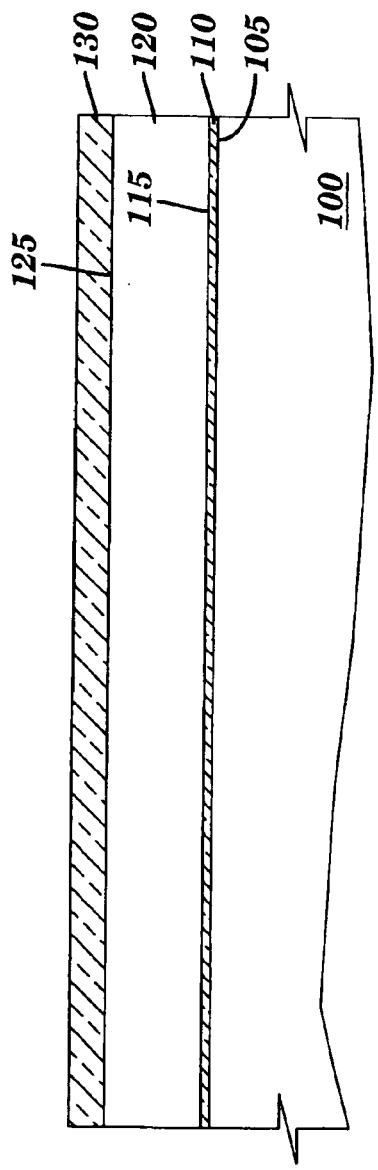

FIGS. 1 through 5, are cross-sectional views illustrating fabrication of a polysilicon line according to the present invention. In FIG. 1, a silicon substrate 100 is provided. Formed on a top surface 105 of silicon substrate 100 is a gate dielectric layer 110 having a thickness "T1." Formed on a top surface 115 of gate dielectric layer 110 is a polysilicon layer 120. Formed on a top surface 125 of polysilicon layer 120 is a hard mask layer 130 having a thickness "T2." In one example, gate dielectric layer 105 is silicon oxide and "T1" is about 11 to 75 Å, polysilicon layer 120 is undoped polysilicon and is about 1000 to 2000 Å thick and hard mask layer 130 is tetraethoxysilane (TEOS) oxide and "T2" is about 50 to 800 Å.

Figure 2:
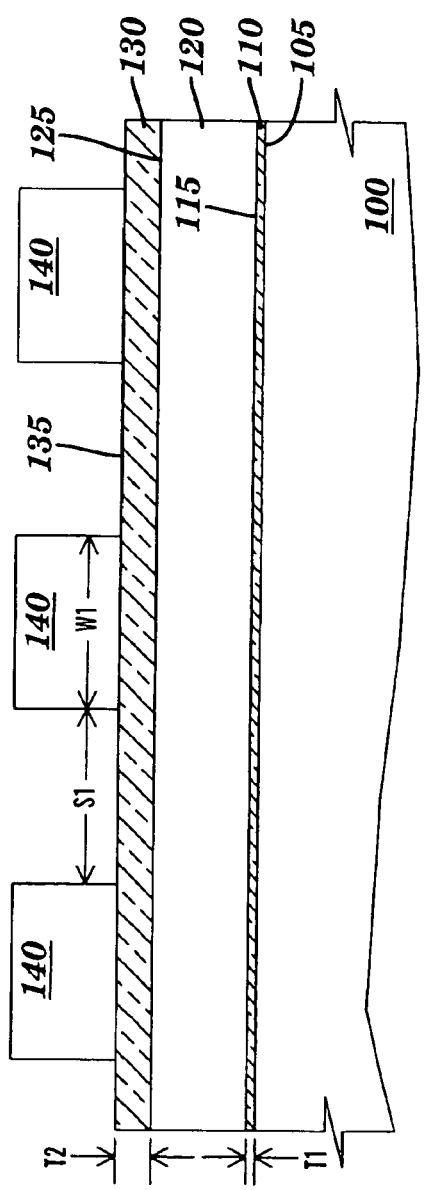

In FIG. 2, a photoresist layer is patterned into photoresist islands 140. Photoresist islands 140 are "W1" wide and spaced "S1" apart. "W1" and "S1" may be equal to the minimum dimension the particular photolithographic process used to produce photoresist islands 140 is capable of producing. In one example, "W1" is about 800 to 1500 Å.

Figure 3:
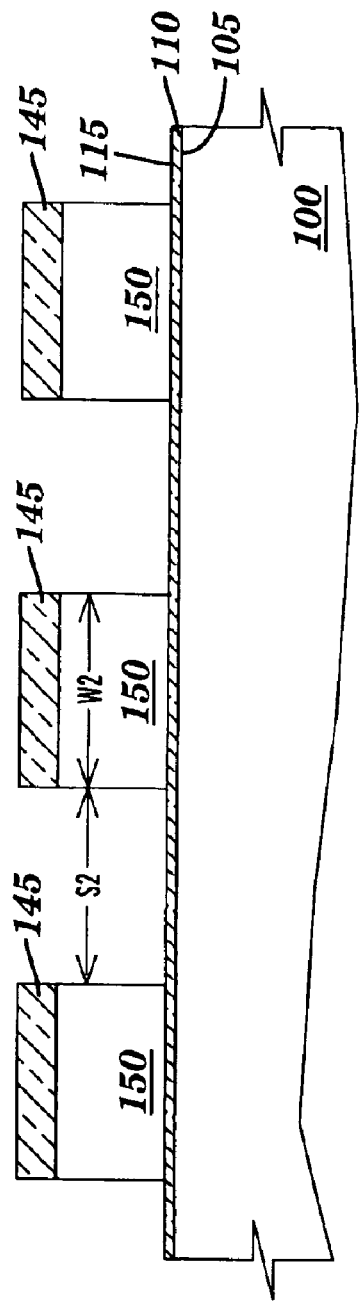

In FIG. 3, an etch of hard mask layer 130 using photoresist islands 140 as an etch mask is performed to form hard mask caps 145, the photoresist islands are removed, and polysilicon layer 120 isotropically etched using the hard mask caps as etch masks to form polysilicon lines 150. Polysilicon lines 150 have a width "W2" and are spaced "S2" apart. Ideally "W1=W2" and "S1"="S2" but due to etch bias "W2" may be slightly smaller than "W1" and "S2" may be slightly larger than "S1." In one example, hard mask caps 145 are formed by a reactive ion etch (RIE) using a process selective silicon oxide to polysilicon (when hard mask layer 130 is TEOS oxide), and polysilicon lines 150 are formed by a RIE process selective polysilicon to silicon oxide (when dielectric layer 110 is silicon oxide.)

Figure 4A:
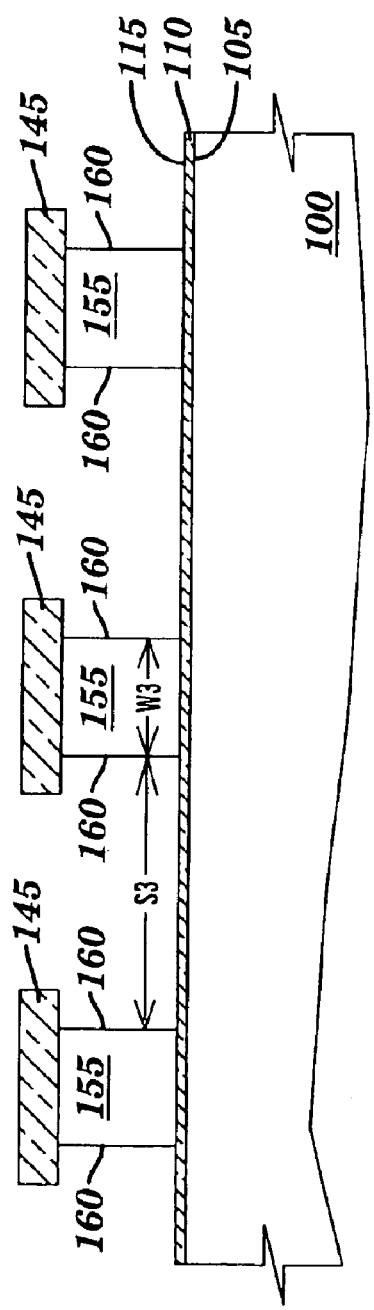

In FIG. 4A, polysilicon lines 150 have been narrowed using an etching process, examples of which are given below, to form narrow polysilicon lines 155. Narrow polysilicon islands have a width "W3" and are spaced "S3" apart. "W3" may be a sub-minimum groundrule dimension. Hard mask caps 145 prevent reduction in the height of narrow polysilicon lines 155 by allowing the etchant access to only to sidewalls 160 of the narrow polysilicon lines. "W3" is less than "W2" and "S3" is greater than "S2." In one example, "W3" is about 300 to 700 Å. The amount of narrowing of the polysilicon lines can be significant. "W3" can be ⅓ the value of "W2." The amount of narrowing is determined by the difference between a measured value of "W2" and a target value for "W3" which is converted to an etch time or number of oxidation/etch cycles. The measurement process is discussed below in reference to FIG. 7.

EXAMPLE I

Exposed polysilicon is first subjected to a saturated aqueous solution of $O_3$ in order convert a thin surface layer to silicon oxide. Then, the silicon oxide so formed is removed in a solution comprising: 1 part 49% HF to about 50 to 300 parts of $H_2O$ (about 5–b 30 seconds.) Process temperature is about 20 to 30° C. With undoped polysilicon about 6 to 7 Å of polysilicon is removed from each exposed surface each times the process performed. To narrow an 800 Å polysilicon line to 300 Å would require about 35 to 40 process cycles. Selectivity of this process polysilicon to silicon oxide is about 10:1. This process is best practiced on a single wafer etch tool such the SEZ Spin Etch 203 manufactured by SEZ (Villach, Austria.)

EXAMPLE II

Exposed polysilicon is first subjected to a saturated aqueous solution of $O_3$ in order convert a thin surface layer to silicon oxide. Then, the silicon oxide so formed is then subjected to a flow of HF vapor mixed with $N_2$, the $HF/N_2$ mixture further mixed with N2 enriched with water vapor for about 5 to 30 seconds in order to remove the silicon oxide layer. With undoped polysilicon about 6 to 7 Å of polysilicon is removed from each sidewall each time the process performed. To narrow an 800 Å polysilicon line to 300 Å would require about 35 to 40 process cycles. Selectivity of this process polysilicon to silicon oxide can range from 1:1 to 1000:1 depending upon the relative HF concentrations and flow rate of water vapor enriched $N_2$. The more water vapor, the closer to 1:1 the selectivity becomes. A suitable vapor etch tool is the Excalibur ISR manufactured by FSI International Corp. (Chaska, Minn.)

EXAMPLE III

Exposed polysilicon is etched in a solution of 1 part 49% HF, about 100 to 200 parts 69% $HNO_3$ and about 100 to 200 parts of 85% $H_3PO_4$. Etch temperature is about 15 to 30° C. The etch rate of undoped polysilicon can range from about 1 to 30 Å per second depending upon dilution, temperature and etch method (bath vs. a spin etch tool.) To narrow an 800 Åpolysilicon line to 300 Å would require about 8 to 250 seconds depending on dilution, temperature and etch method. Selectivity of this process polysilicon to silicon oxide is will also be dependent upon dilution, temperature and etch method.

EXAMPLE IV

Exposed polysilicon is etched in a solution of 1.3 parts 30% $NH_4OH$, 3.1 parts 31% $H_2O_2$ and 80 parts of $H_2O$. Etch rate varies with etch temperature. At 45° C. or less the undoped polysilicon etch rate is about 4.5 Å removed in 5 minutes. At 60° C. the etch rate of undoped polysilicon etch rate is about 10 Å removed in 5 minutes. At 62° C. the etch rate of undoped polysilicon is about 29 Å removed in 5 minutes. Total etch time must be traded off against etch precision. To narrow an 800 Å polysilicon line to 300 Å with a 30 to 45° C. etch temperature would require about 110 minutes. Selectivity of this process polysilicon to silicon oxide is about 100:1.

FIG. 4B is similar to FIG. 4B except that hard mask caps 145A has been purposefully reduced to a thickness "T3", where "T3" is approximately less than or equal to dielectric layer 110 thickness "T1" during the polysilicon etch process. This is accomplished by adjusting the original thickness, "T2" and/or the etch rate of hard mask layer 130 such the polysilicon etch process removes an amount of hard mask caps 145 equal to about the difference between "T2" and "T1." The thickness of hard mask caps 145A is purposefully reduced in order to minimize the amount of undercut of dielectric layer 110 when the hard mask caps are removed if the hard mask cap removal process also etches the dielectric layer. In a first example, "T1" is 50 Å, the undoped polysilicon etch rate is 10 Å per second, the undoped polysilicon line is narrowed from 800 to 300 Å, hard mask caps 145 are formed from a dense TEOS oxide, and the etch rate ratio of undoped polysilicon to TEOS oxide is 100 to 1. Only 2.5 Å of then the hard mask caps 145 will be removed. Therefore, hard mask caps 145 can be no thicker than about 50 Å.

In a second example, "T1" is 50 Å, the undoped polysilicon etch rate is 10 Å per second, the undoped polysilicon line is narrowed from 800 to 300 Å, hard mask caps 145 are a low-density TEOS oxide and the etch rate ratio of undoped polysilicon to TEOS oxide is 10 to 1. About 25 Å of hard mask caps 145 will be removed. Therefore, hard mask caps 145 can be no thicker than about 75 Å and are reduced to about 50 Å by the polysilicon etch process.

In FIG. 5, hard mask caps 145 or 145A and exposed portions of dielectric layer 110 are removed using an RIE process selective silicon oxide to silicon to form dielectric islands 165.

Narrow polysilicon lines 155 may be used for interconnection of semiconductor devices to form integrated circuits, for wordlines and passing wordlines in DRAM devices and for gates of FETs.

Figures 6, 7:
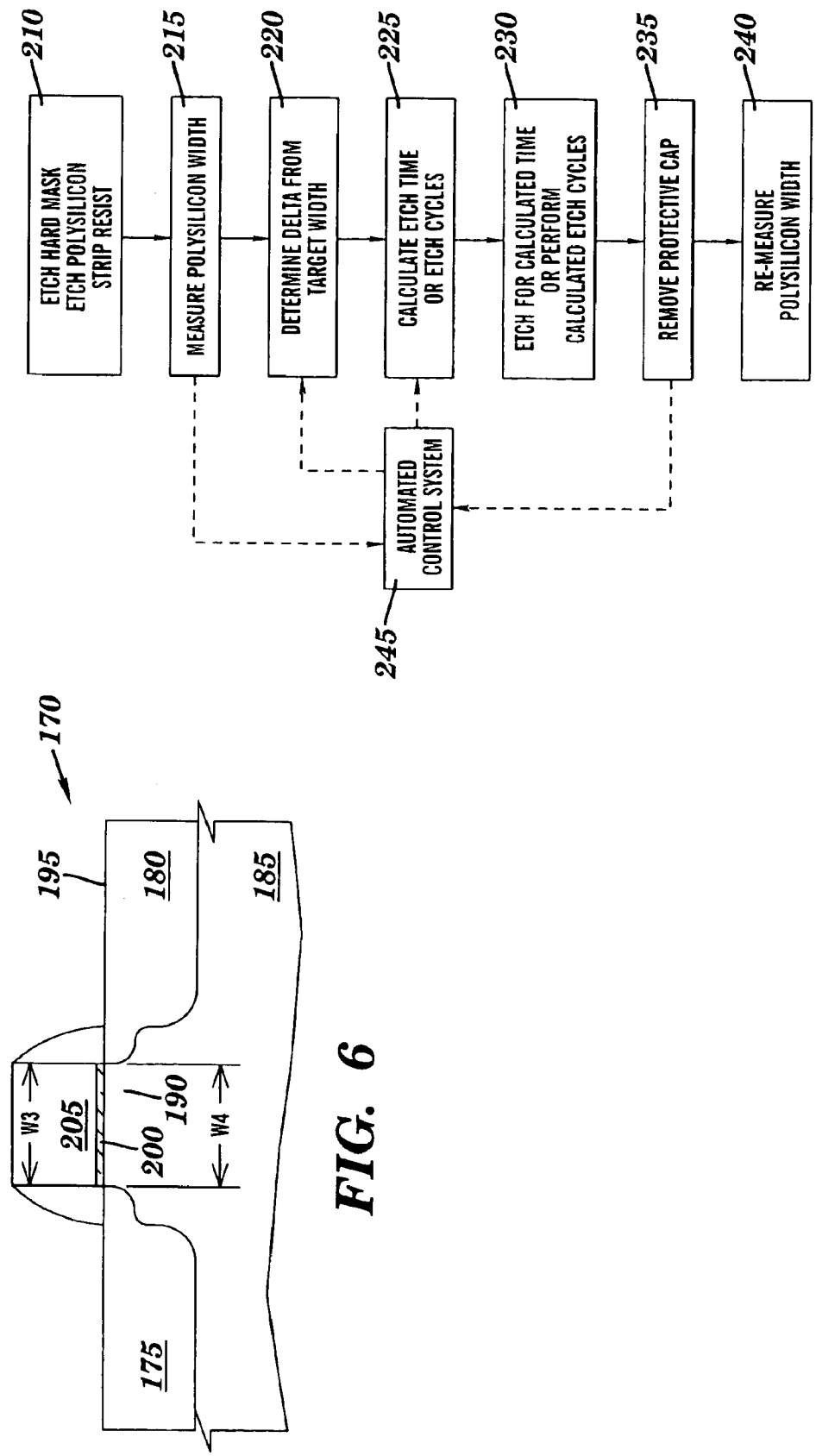
FIG. 6 is a cross-sectional view of a FET having a reduced dimension gate fabricated according to the present invention.
FIG. 7 is a flowchart illustrating the method of fabricating a polysilicon line according to the present invention.

FIG. 6 is a cross-sectional view of a FET having a reduced dimension gate fabricated according to the present invention. FET 170 comprises first and second source/drain regions 175 and 180 formed in a substrate 185. Substrate 185 may be silicon, silicon on insulator, gallium arsenide or sapphire. Also formed in substrate 185, between first and second source/drain regions 175 and 180 is a channel region 190. Formed on a top surface 195 of substrate 185 over channel region 190 is a gate dielectric 200. Formed on gate dielectric 200 is a gate electrode 205 having a width "W3." Gate dielectric and gate electrode 205 may be formed by the method of the present invention. When gate electrode 205 is formed by the method of the present invention "W4" may be a sub-minimum groundrule dimension.

A typical fabrication sequence for FET 170 comprises first forming N and P wells, and trench isolation and other structures not illustrated in FIG. 6, in substrate 185. Next, a gate dielectric layer is formed on top surface 195 of substrate 185. Then, an undoped polysilicon layer is formed on top of the gate dielectric layer followed by forming a hard mask cap layer on top of the gate dielectric layer. Next, the hard mask layer is patterned and etched to form hard mask caps. Then, the polysilicon layer is etched and then narrowed according to the present invention, to produce conductive gate electrode 205. Next, the hard mask cap is removed and first, and second source/drains 175 and 180 and channel region 190 formed in substrate 185. Next, the exposed dielectric layer is removed to form gate dielectric 200. Alternatively, the hard mask caps may be removed when the exposed dielectric layer is removed. FET 170 may be completed by forming contacts to first and second source drains 175, 180, and gate electrode 205. Since, in this fabrication the channel width "W4" is largely determined by the gate width "W3" very short channel width devices can be fabricated, especially when "W3" is a sub-minimum groundrule dimension.

FIG. 7 is a flowchart illustrating the method of fabricating a polysilicon line according to the present invention. In step 210, hard mask layer 130, polysilicon layer 110 have been etched to form polysilicon lines 150 and hard mask caps 145 and photoresist islands 140 removed as illustrated in FIG. 3 and described above.

In step 215, the width "W2" of a representative polysilicon line 150 is measured. The measurement is performed on polysilicon line 150 rather than hard mask cap 145 or even resist island 140 because polysilicon being conductive, images better in a scanning electron microscope (SEM). An SEM is used because of the very small dimensions being measured are beyond the ability of optical measurement tools. The actual "W2" measurement may be made on a structure allowing for electrical linewidth measurement after further fabrication steps. "W2" is a polysilicon line 150 linewidth measurement not a measurement of a hard mask cap 145 so must the measurement is made in a tool where the presence of the hard mask cap will not interfere with the polysilicon measurement. It is desirable that the polysilicon linewidth measurement has a repeatability of 1 to 2 Å. A suitable SEM measurement tool is a Verasen™ (manufactured by Applied Materials, Santa Clara) using a any number of commercially available measurement software packages.

In step 220, the delta from the target width, "W2"–"W3" is determined.

In step 225, the polysilicon etch time or number of oxidation/etch cycles to reduce width of polysilicon line 150 from measured "W2" to target "W3" is calculated.

In step 230, polysilicon lines 150 are etched for the etch time determined in step 225 or the number of oxidation/etch cycles determined in step 225 are performed in order to produce polysilicon line 155 having a width "W3" as illustrated in FIG. 4A or 4B and described above.

In step 235, the actual width "W3" of a representative polysilicon line 155 is measured to confirm the etch process.

In optional step 240, hard mask caps 145 or 145A are removed. Removal of hard mask caps 145 or 145A may be simultaneous with etching of gate dielectric layer 110.

As illustrated in FIG. 7, the "W 2" measurement from step 215 and the actual "W3," measurement from step 235 may be sent to an automated control system 245 and stored in a history database. Automated control system 245, would have access to an etch rate database and target "W3" values and could determine the delta from target for step 220 and etch time or number of oxidation/etch cycles for step 225. Automated control system 245, could update etch rate data based on the history database.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating a polysilicon line, comprising:

forming a patterned hard mask layer over a polysilicon layer;

patterning the polysilicon layer to provide a hard mask-capped polysilicon line having a first width; and isotropically removing portions of said polysilicon line to reduce said polysilicon line to a second width by converting a surface layer of said polysilicon line to an oxide layer and isotropically etching said oxide layer.

2. The method of claim 1, wherein said second width has a value less than a value of a minimum dimension producible by a photolithographic process used to form said patterned hard mask layer.

3. The method of claim 1, further including removing said patterned hard mask layer.

4. The method of claim 1, wherein said patterned hard mask layer comprises silicon oxide.

5. The method of claim 1, wherein the step of removing portions of the polysilicon line includes oxidizing a surface of said polysilicon line in a saturated aqueous solution of $O_3$ to form said oxide layer on said polysilicon line followed by etching said oxide layer in a solution comprising HF in water.

6. The method of claim 1, wherein the step of removing portions of the polysilicon line includes oxidizing a surface of said polysilicon line in a saturated aqueous solution of $O_3$ to form said oxide layer on said polysilicon line followed by etching said oxide layer in an HF containing vapor.

7. A method of forming a transistor gate, comprising:

forming a dielectric layer on a top surface of a substrate;

forming a polysilicon layer on a top surface of said dielectric layer;

forming a patterned hard mask layer on a top surface of said polysilicon layer;

patterning the polysilicon to provide a hard mask-capped polysilicon electrode having a first width;

isotropically removing portions of the polysilicon electrode to reduce said polysilicon line to a second width by converting a surface layer of said polysilicon line to an oxide layer and isotropically etching said oxide layer; and removing said patterned hard mask layer.

8. The method of claim 7, wherein said second width has a value less than a value of a minimum dimension producible by a photolithographic process used to form said patterned bard mask layer.

9. The method of claim 7, further including simultaneously removing portions of said dielectric layer not covered by said polysilicon electrode and said patterned hard mask.

10. The method of claim 7, wherein said hard mask layer and said dielectric layer comprise silicon oxide.

11. The method of claim 7, wherein said substrate is selected from the group consisting of silicon substrates, silicon on insulator substrates, gallium arsenide substrates and sapphire substrates.

12. The method of claim 7, wherein the step of removing portions of the polysilicon electrode includes oxidizing a surface of said polysilicon electrode in a saturated aqueous solution of $O_3$ to form said oxide layer on said polysilicon electrode followed by etching said oxide layer in solution comprising HF in water.

13. The method of claim 7, wherein the step of removing portions of the polysilicon electrode includes oxidizing a surface of said polysilicon electrode in a saturated aqueous solution of $O_3$ to form said polysilicon electrode followed by etching said oxide layer in an HF containing vapor.

14. A method of forming a transistor gate, comprising:

forming a dielectric layer on a top surface of a substrate;

forming a polysilicon layer on a top surface of said dielectric layer;

forming a patterned hard mask layer on a top surface of said polysilicon layer;

patterning the polysilicon to provide a hard mask-capped polysilicon electrode having a first width;

measuring said first width;

comparing said first width to a target width and determining a differential between said first width and said target width;

calculating a number of polysilicon oxidation/isotropic polysilicon oxide etch cycles based on said differential; and performing the calculated number of polysilicon oxidation/isotropic polysilicon oxide etch cycles.

15. The method of claim 14, wherein said target width has a value less than a value of a minimum dimension producible by a photolithographic process used to form said patterned hard mask layer.

16. The method of claim 14, further including removing said patterned hard mask layer.

17. The method of claim 14, further including simultaneously removing portions of said dielectric layer not covered by said polysilicon electrode and said patterned hard mask.

18. The method of claim 14, wherein said hard mask layer and said dielectric layer comprise silicon oxide.

19. The method of claim 14, wherein said substrate is selected from the group consisting of silicon substrates, silicon on insulator substrates, gallium arsenide substrates and sapphire substrates.

* * * * *

UNITED STATES PATENT AND TRADEMARK OFFICE
CERTIFICATE OF CORRECTION

PATENT NO. : 6,884,722 B2
DATED : April 26, 2005
INVENTOR(S) : Casey Grant et al.

It is certified that error appears in the above-identified patent and that said Letters Patent is hereby corrected as shown below:

Column 7,
Line 37, delete "form said polysillicon electrode" and insert -- form said oxide layer on said polysilicon electrode --.

Signed and Sealed this

Sixteenth Day of August, 2005

JON W. DUDAS
*Director of the United States Patent and Trademark Office*